United States Patent
Elmhurst et al.

(10) Patent No.: US 7,177,186 B2
(45) Date of Patent: Feb. 13, 2007

(54) HIGH BANDWIDTH DATAPATH LOAD AND TEST OF MULTI-LEVEL MEMORY CELLS

(75) Inventors: Daniel R. Elmhurst, Cameron Park, CA (US); Karthikeyan Ramamurthi, Folsom, CA (US); Quan H. Ngo, Sacramento, CA (US); Robert L. Melcher, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/391,509

(22) Filed: Mar. 28, 2006

(65) Prior Publication Data

US 2006/0193172 A1 Aug. 31, 2006

Related U.S. Application Data

(62) Division of application No. 10/335,961, filed on Dec. 31, 2002, now Pat. No. 7,075,822.

(51) Int. Cl.
*G11C 16/06* (2006.01)

(52) U.S. Cl. ............ 365/185.03; 365/201; 365/189.07; 365/185.22

(58) Field of Classification Search ........... 365/185.03, 365/201, 189.07, 185.22
See application file for complete search history.

(56) References Cited

U.S. PATENT DOCUMENTS 5,659,549 A * 8/1997 Oh et al. .................... 714/720
6,396,742 B1 * 5/2002 Korsh et al. ........... 365/185.22

* cited by examiner

*Primary Examiner*—Richard T. Elms
*Assistant Examiner*—N Nguyen
(74) *Attorney, Agent, or Firm*—Trop, Pruner & Hu, P.C.

(57) ABSTRACT

An apparatus and technique for testing of multi-level cells (MLC) in a memory storage device using a high bandwidth data path architecture. The technique includes hardware for obtaining a first data and a second data from a multilevel cell memory. The first data is different from the second data. The first data and second data are compared and, based at least in part on this comparison, the multilevel cell memory is programmed. Programming the multilevel cell memory includes accessing memory cells in the multilevel cell memory and determining the number of bits per memory cell of the first data that need programming.

6 Claims, 7 Drawing Sheets

US 7,177,186 B2

HIGH BANDWIDTH DATAPATH LOAD AND TEST OF MULTI-LEVEL MEMORY CELLS

CROSS-REFERENCE TO RELATED APPLICATIONS

This application is a divisional of U.S. patent application Ser. No. 10/335,961, filed on Dec. 31, 2002 now U.S. Pat. No. 7,075,822.

BACKGROUND

This invention relates generally to an apparatus and technique for testing of multi-level cells (MLC) in a memory storage device, and more particularly to a system that tests multi-level memory cells using a high bandwidth data path architecture.

A typical memory storage device may include a number of memory cells, each capable of storing a zero or one bit. Memory cells may be grouped together in a memory cell array containing a pattern of zeros and ones. Data bits can be loaded into memory cell arrays by identifying a word made up of memory cells in the array and storing the expected data bits into the memory cells of the word.

A memory cell may be tested by using an iterative test technique in which the memory cell is loaded with a reference zero or one bit pattern, the pattern read from the memory cell and compared against the reference value. Memory cell arrays similarly may be tested by loading reference sequences of ones and zeros into the array, reading the values stored in the memory cell array, and comparing them against the reference sequence. Exhaustive testing of a memory cell array including n memory cells requires testing all combinations of ones and zeros that may be stored in the memory cell array. Thus, up to $2^n$ load/store tests described above may have to be performed to adequately test the memory cell array. Such exhaustive testing may be time consuming and costly, adding significantly to the final cost of the memory storage device.

Another type of memory storage device may include multilevel cells (MLCs). Each MLC may have more than two logic levels. Due to its ability to indicate more than two logical states, multiple bits may be stored in each MLC. These multiple bits per cell create additional challenges for testing a memory storage device having MLCs.

Thus, there is a continuing need for better ways to test an MLC memory that reduces test time and does not require increased hardware and die area.

DETAILED DESCRIPTION

Figure 1:
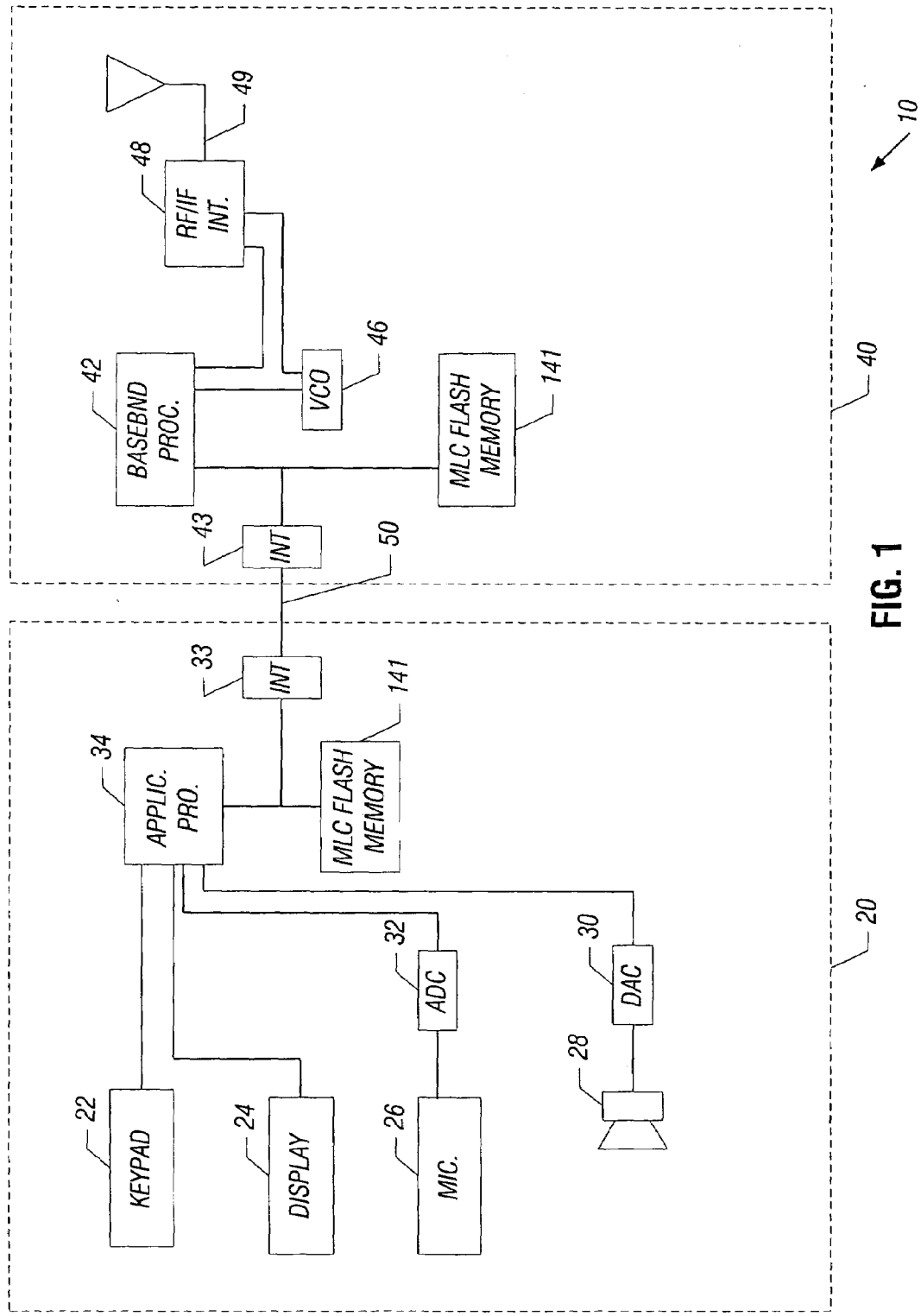
FIG. 1 is a block diagram of a portable computing or communication device including the MLC flash memory according to an embodiment of the invention.

Referring to FIG. 1, some embodiments 10 of a portable computing or communication device (called a "portable device 10" herein) includes an application subsystem 20 and a communication subsystem 40 that communicate via a communication link 50 of the device 10. As a more specific example, the portable device 10 may be a one-way pager, a two-way pager, a personal communication system (PCS), a personal digital assistant (PDA), a cellular telephone, a portable computer, etc. The application subsystem 20 provides features and capabilities that are visible and/or used by a user of the portable device 10. For example, the application subsystem 20 may be used for purposes of email, calendaring, audio, video, gaming, etc. The communication subsystem 40 may be used for purposes of providing wireless and/or wired communication with other networks, such as cellular networks, wireless local area networks, etc.

For the case in which the portable device 10 is a cellular telephone, the application subsystem 20 may provide an interface to the user of the cellular telephone and thus, provide a keypad 22 which the user may use to enter instructions and telephone numbers into the cellular telephone; a display 24 for displaying command options, caller information, telephone numbers, etc.; and a microphone 26 for sensing commands and/or voice data from the user. The microphone 26 thus, may provide an analog signal indicative of a voice signal, and this analog signal may be converted into a digital format by an analog-to-digital converter (ADC) 32. The digital data from the ADC 32, in turn, is provided to an application processor 34 of the application subsystem 20. Likewise, data from the keypad 22 may also be provided to the application processor 34. Graphical data may be provided by the application processor 34 to the display 24 for viewing by the user of the cellular telephone.

Among the other features of the application subsystem 20, the subsystem 20 may include a speaker 28 that receives an analog signal from a digital-to-analog converter (DAC) 30 that, in turn, receives digital data from the application processor 34. For example, the speaker 28 may be used to provide an audible ringing signal to the user, for the case in which the device 10 is a cellular telephone, as well as provide an audio stream for audio data that is provided by a cellular network, for example.

The application subsystem 20 may also include a memory 141. As an example, this memory 141 may be a dynamic random access memory (DRAM) or, as shown in FIG. 1, a MLC flash memory, as just a few examples. The memory 141 is coupled to the application processor 34 for purposes of storing data, operating system code, application code, etc. that is executed by the application processor 34. As a more specific example, in some embodiments of the invention, the memory 141 may store boot instruction code that is executed by the application processor 34 for power-on-self-test purposes. The application subsystem 20 may also include an interface 33 for purposes of establishing a communication bridge between the communication link 50 and circuitry of the application subsystem 20.

In some embodiments of the invention, the portable device 10 may include multiple communication subsystems, and in some embodiments of the invention, the portable device 10 may include multiple nodes that are coupled to the communication link 50.

In some embodiments of the invention, the communication subsystem 40 includes a baseband processor 42 that establishes the particular communication standard for the device 10. For example, if the device 10 is a cellular telephone, the baseband processor 42 may establish a code division multiple access (CDMA) cellular radiotelephone communication system, or a wide-band CDMA (W-CDMA) radiotelephone communication system, as just a few examples. The W-CDMA specifically has been proposed as a solution to third generation ("3G") by the European Telecommunications Standards Institute (ETSI) as their proposal to the International Telecommunication Union (ITU) for International Mobile Telecommunications (IMT)-2000 for Future Public Land Mobile Telecommunications Systems (FPLMTS).

The baseband processor 42 is coupled to a radio frequency/intermediate frequency (RF/IF) interface 48 that forms an analog interface for communicating with an antenna 49 of the device 10. A voltage controlled oscillator (VCO) 46 is coupled to the RF/IF interface 48 to provide signals having the appropriate frequencies for modulation and demodulation, and the baseband processor 42 controls the VCO 46 to regulate these frequencies, in some embodiments of the invention.

Among the other features of the communication subsystem 40, in some embodiments of the invention, the subsystem 40 may include a memory 141 (a DRAM memory or, as shown in FIG. 1, a MLC flash memory, as a few examples) that is coupled to the baseband processor 42. The memory 141 may store program instructions and/or data. For example, in some embodiments of the invention, the memory 141 stores Basic-Input-Output-System (BIOS) code routines that are the low-level software interface with the hardware.

The processor 34 or 42 may include one or more microprocessors, such as a Pentium microprocessor, for example. In some embodiments of the invention, the baseband processor 42 may be a digital signal processing (DSP) engine. Other and different processors may be used for the application 34 and baseband 42 processors.

The MLC flash memory device 141 is an electrically erasable and programmable read-only memory (EEPROM). Electrically erasable and programmable read-only memory devices have arrays of what are known as flash cells, also called flash EEPROMs or flash memory devices, and are found in a wide variety of electrical devices. A flash memory device is typically formed in an integrated circuit. A conventional flash cell, also called a floating gate transistor memory cell, is similar to a field effect transistor, having a channel region between a source and a drain in a substrate and a control gate over the channel region. In addition the flash cell has a floating gate between the control gate and the channel region. The floating gate is separated from the channel region by a layer of gate oxide, and an inter-poly dielectric layer separates the control gate from the floating gate. Both the control gate and the floating gate are formed of doped polysilicon. The floating gate is floating or electrically isolated. The flash memory device has a large number of flash cells in an array where the control gate of each flash cell is connected to a word line and the drain is connected to a bit line, the flash cells being arranged in a grid of word lines and bit lines.

A flash cell may be programmed by applying approximately 10 volts to the control gate, between 5 and 7 volts to the drain, and grounding the source and the substrate to induce hot electron injection from the channel region to the floating gate through the gate oxide. The voltage at the control gate determines the amount of charge residing on the floating gate after programming. The charge affects current in the channel region by determining the voltage that must be applied to the control gate in order to allow the flash cell to conduct current between the source and the drain. This voltage is termed the threshold voltage $V_T$ of the flash cell, and is the physical form of the data stored in the flash cell. As the charge on the floating gate increases the threshold voltage increases.

One type of memory storage device includes an array of multi-state flash memory cells. Multi-state flash memory cells have the same structure as ordinary flash memory cells but are capable of storing two bits or more of data in a single memory cell. When storing two bits of data, a multi-state flash memory cell has four distinct threshold voltage levels over a voltage range. Each distinct threshold voltage level $V_T$ corresponds to a particular pattern of bits. Thus, in some embodiments, $V_{T0}$ corresponds to Level 0 and equals 11, $V_{T1}$ corresponds to Level 1 and equals 10, $V_{T2}$ corresponds to Level 2 and equals 01, and $V_{T3}$ corresponds to Level 3 and equals 00.

Data is stored in conventional flash memory devices by programming flash cells that have been previously erased. A flash cell is erased by applying approximately −10 volts to the control gate, 5 volts to the source, grounding the substrate and allowing the drain to float, although this is not a limitation of the present invention. In an alternate technique of erasure the control gate is grounded and 12 volts is applied to the source. The electrons in the floating gate are induced to pass through the gate oxide to the source by Fowler-Nordheim tunneling such that the charge in the floating gate is reduced and the threshold voltage of the flash cell is reduced. Flash cells in an array in a flash memory device may be grouped into blocks, and the cells in each block are erased together.

A flash cell is read by applying approximately 5 volts to the control gate, approximately 1 volt to the drain, and grounding the source and the substrate. The flash cell may be rendered conductive and current in the cell is sensed to determine data stored in the flash cell. The current is converted to a voltage that is compared with one or more reference voltages in a sense amplifier to determine the state of the flash cell. The current drawn by a flash cell being read depends on the amount of charge stored in the floating gate.

Testing of a single bit flash memory cell includes use of a register that identifies a flash memory cell, with a load instruction using the identification register to load a zero or one bit into the flash memory cell. Thus, for a load/store instruction architecture with 16 bit words, a flash memory array with 16 flash memory cells has 16 registers to access each of the cells during a single load/store instruction. For MLC flash memory that store two bits in each memory cell, two registers must be used, each register identifying one bit in the memory cell. Use of synchronous burst read/write interfaces that allow synchronous read/write transfers to 64 memory cells further increases the number of registers to 128. Higher bandwidth synchronous burst read/write interfaces increase the number of registers needed to access each memory cell, increasing the overall flash memory device die area.

Figure 2:
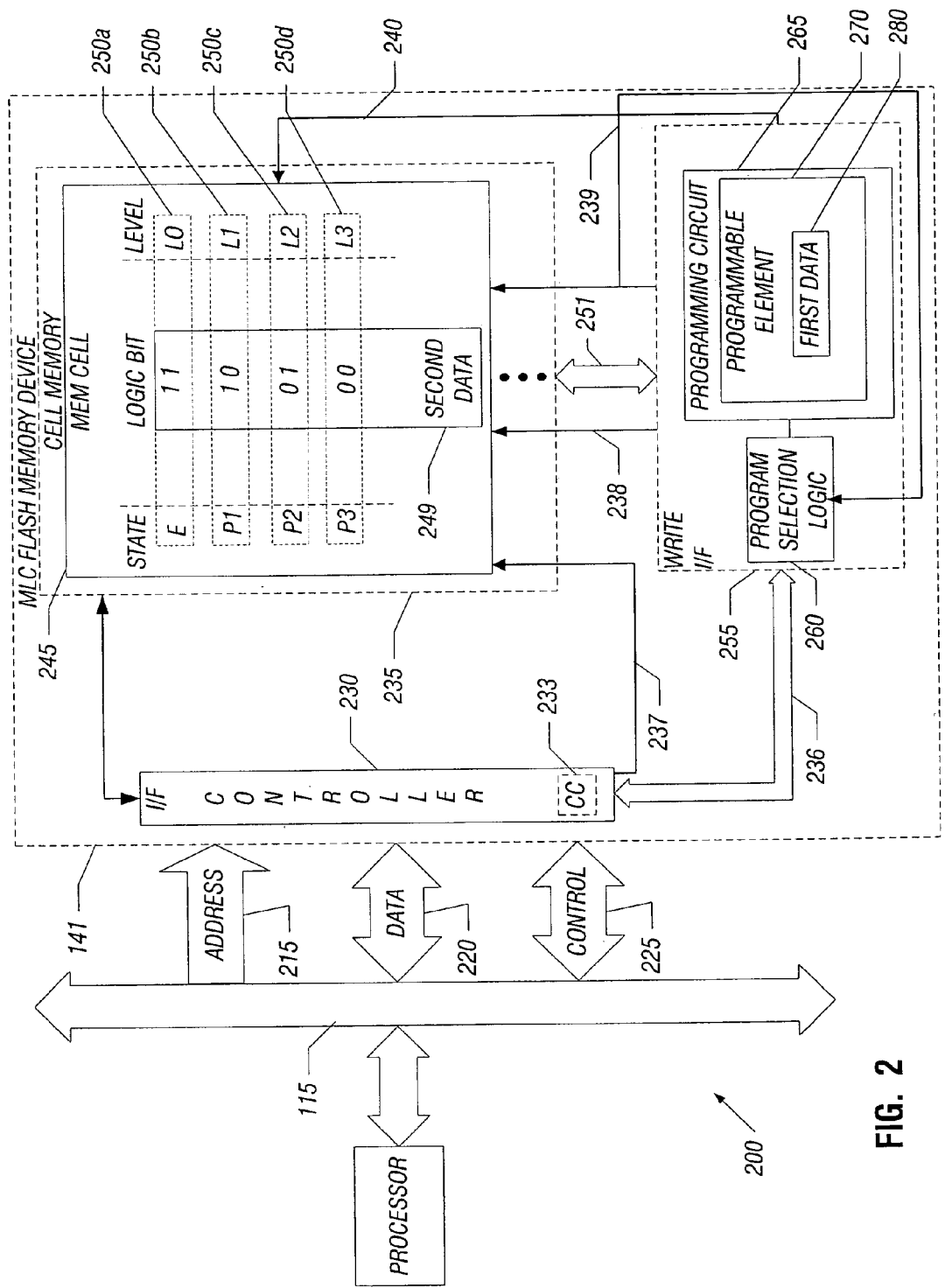
FIG. 2 is a schematic depiction of a MLC flash memory device showing hardware to program memory cells and perform test according to an embodiment of the invention.

Referring to FIG. 2, the MLC flash memory device 141 of FIG. 1 including hardware to test memory cells is shown in greater detail. A processor as described in FIG. 1 may be connected over a host bus 115 through address 215, data 220, and control 225 lines to the MLC flash memory device 141. The MLC flash memory device includes an interface (I/F) controller 230, cell memory 235 and write interface (I/F) 255. In some embodiments of the invention, the I/F controller 230 further includes a command controller (CC) 233 described in more detail below with reference to FIG. 5. Write I/F 255 in some embodiments of the invention further includes program selection 260 logic and programming circuit 265. Programming circuit 265 further includes a programmable element 270 that has a first data storage 280. A memory cell 245 for some exemplary embodiments is shown in FIG. 2. The MLC memory cell may store two bits of data in second data 249 as illustrated in FIG. 2 corresponding to a $V_T$ level. In some embodiments of the invention, the levels may be L0 250a (11 data bits), level L1 250b (10 data bits), level L2 250c (01 data bits), and level L3 250d (00 data bits).

The operation of the MLC flash memory device 141 in accordance with some embodiments of the invention includes a program command generated by the processor executing software. Software executing on the processor may be assembly language software code for programming or testing the MLC flash memory device 141 during manufacture or operation of the computer system. In some embodiments of the invention, the software executing on processor may be for programming upgrades to the data and programs (i.e. system configuration data, test programs, hardware input/output programs, etc.) stored in the MLC flash memory device 141. The program command may generate write instructions to write a word of data to a particular memory cell array located in the MLC flash memory device 141. The data to be written to the memory cell array may be transferred over the host bus 115 through data lines 220 to I/F controller 230. Similarly, address information identifying a memory cell array in MLC flash memory device 141 is generated by processor for the write instruction and sent to the I/F controller 230 over address lines 215. Control information including setting write enable and chip enable for writing data to the memory cell array is sent to the MLC flash memory device over control lines 225. In some embodiments of the invention, address, data and control information may be sent simultaneously or, in other embodiments, sent sequentially by the processor executing the program command. The I/F controller 230 after receiving the address, data, and control information identifying a write instruction to a memory cell array decodes and reformats the information to generate control, data and address signals for the particular MLC flash memory device 141. The I/F controller sends data to a data buffer, that in some embodiments may be a First-In-First-Out (FIFO) buffer, located in the program selection logic 260 of the write I/F 255 over data/address/control bus 236. Address information identifying the memory cell in the memory cell array for writing data is sent over the data/address/control bus 236 to the program selection logic 260 located in the write I/F 255. Control information including cell memory signal enable are also sent over data/address/control bus 236 to write I/F 255. Data/address/control bus 236 may be implemented as a single bus 236 or in another embodiment as three separate buses. Program signal enable 238, verify signal enable 239 and load signal enable 240 are used by program selection logic 260 to generate and verify the pulses required by the cell memory to reach the correct $V_T$ corresponding to a particular level and bit pattern as described in greater detail below.

Figure 3:
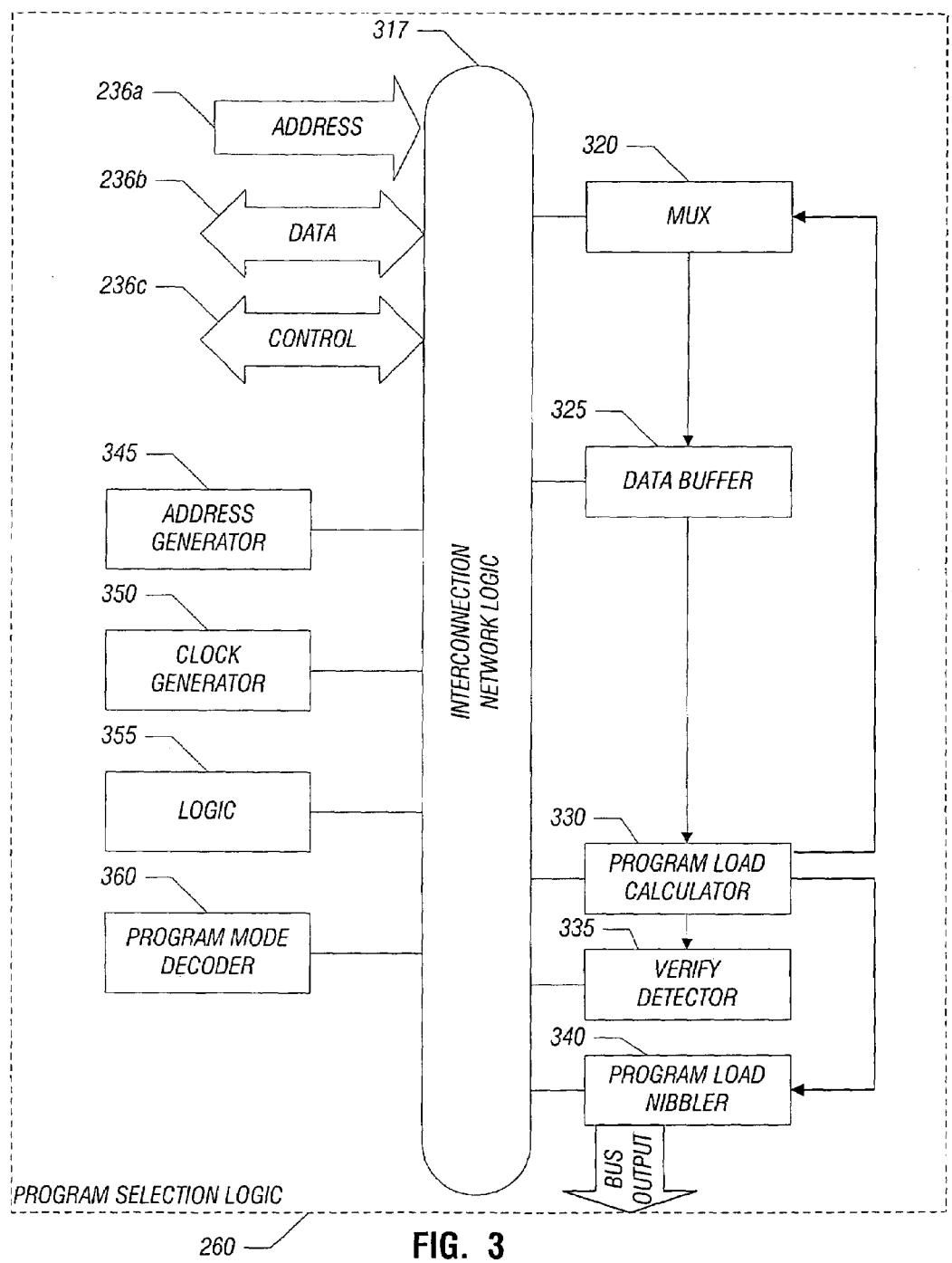
FIG. 3 is a schematic depiction of a program selection logic in the write interface logic according to an embodiment of the invention.

Referring now to FIG. 3, the program selection logic 260 in the write I/F is shown for some embodiments. In these embodiments of the invention, data/address/control bus 236 is subdivided into separate address lines 236a, data lines 236b, and control lines 236c. Data lines 236b in some embodiments of the invention carry programmable element data 270 that includes first data 280. Data lines 236b may include the functionality of read data lines 251 (see FIG. 2) to be a common bus between I/F controller 230, cell memory 235 and write I/F 255 and carry second data 249 stored in a memory cell. Address lines 236a, data lines 236b, and control lines 236c transmit and receive information over interconnection network logic 317. In some embodiments of the invention, interconnection network logic 317 may be direct electrical connections between each of the address lines 236a, data lines 236b, control lines 236c and the various functional logic blocks shown in FIG. 3 (i.e. mux 320, data buffer 325, clock generator 350, etc). Furthermore, in some embodiments of the invention, each of the functional logic blocks may connect to each other by separate direct electrical connections. In other embodiments of the invention, interconnection network logic 317 may be a primary bus through which address, data, control information is communicated to each of the functional logic blocks.

Operation of the program selection logic 260 is now described in greater detail. Data flows over data lines 236b into multiplexer (mux) 320. Mux 320 includes a control input line that when enabled during test mode effectively "doubles up" incoming data. For example, if the data input is a single data bit equal 0, the mux passes 00 on to data buffer 325. Thus, for a data input sequence of 0101 1111, the mux outputs a sequence of 00110011 11111111 to data buffer 325. In some embodiments of the invention, mux 320 may be a 4 to 1 mux with a single output bus of 128 bit data width. Data that flows into mux 320 includes first data 280 or second data 249. The data is stored in data buffer 325 which in some embodiments of the invention is capable of storing 512 bits. Thus, the data buffer 325 may function as a queue into which the mux allows blocks of 128 data bits at a time up to a maximum of 512 bits. When the MLC flash memory device is in test mode, the program load calculator 330 receives 128 data bits from the data buffer and searches for Level 3 bit pattern 00, Level 2 bit pattern 01, or Level 1 bit pattern 10. The program load calculator enables the bitline voltage for program pulsing if it finds a bit pattern equal 00, 01, or 10. If the program load calculator finds a bit pattern equal 11, it disables the bitline voltage during program pulsing. Each bit pattern is transmitted by the program load calculator 332 to the program load nibbler 340. Program load nibbler 340 passes each bit pattern to programming circuit 265 through the output bus along with control information for enabling or disabling bitline voltage. Data buffer address generator 345, data buffer clock generator 350 and data buffer mask logic 355 control transfer of data from the mux 320 to the data buffer 325. Program mode decoder 360 controls transfer of bit patterns to program load calculator 330 and searching for a particular pattern of bits as described above.

Referring to FIGS. 2 and 3, operation of the MLC flash memory device hardware shown in FIG. 2 and the program selection logic 260 shown in FIG. 3, in some embodiments of the invention, may be adapted to perform testing of memory cell arrays in conjunction with the techniques shown in FIG. 4 and FIG. 6 and described below. During normal device operation (i.e. the flash memory is used in functioning of the system of FIG. 1) when the MLC flash memory device is not in test mode, the hardware shown in FIG. 2 and FIG. 3 may be adapted to efficiently and quickly program the MLC flash memory device. Thus, no extra chip die area is required for hardware to test the MLC flash memory device 141.

Figure 4A:
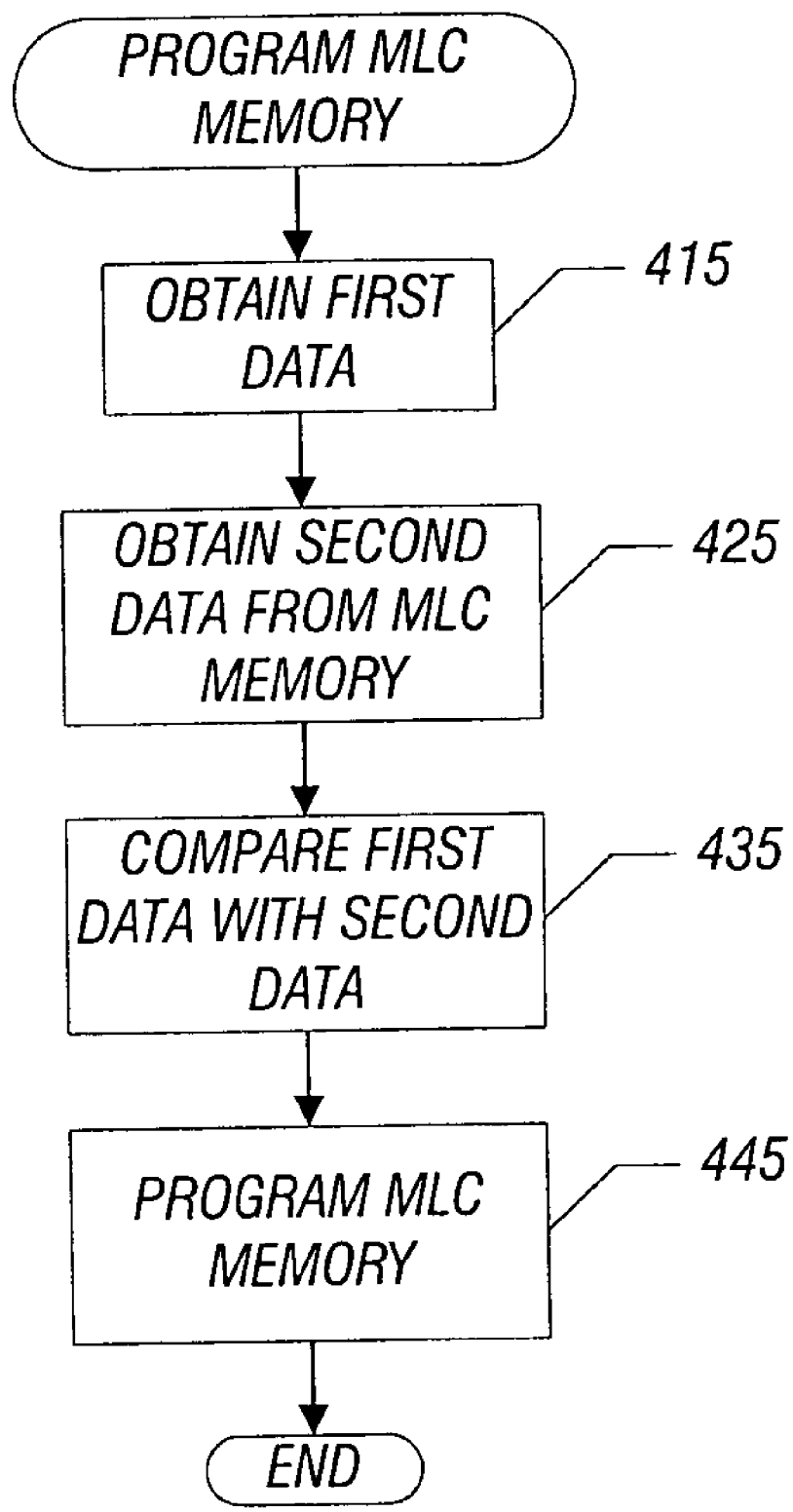
FIGS. 4a and 4b are flow charts showing the MLC program technique that may be adapted to test the MLC flash memory device in accordance with an embodiment of the invention.
Figure 4B:
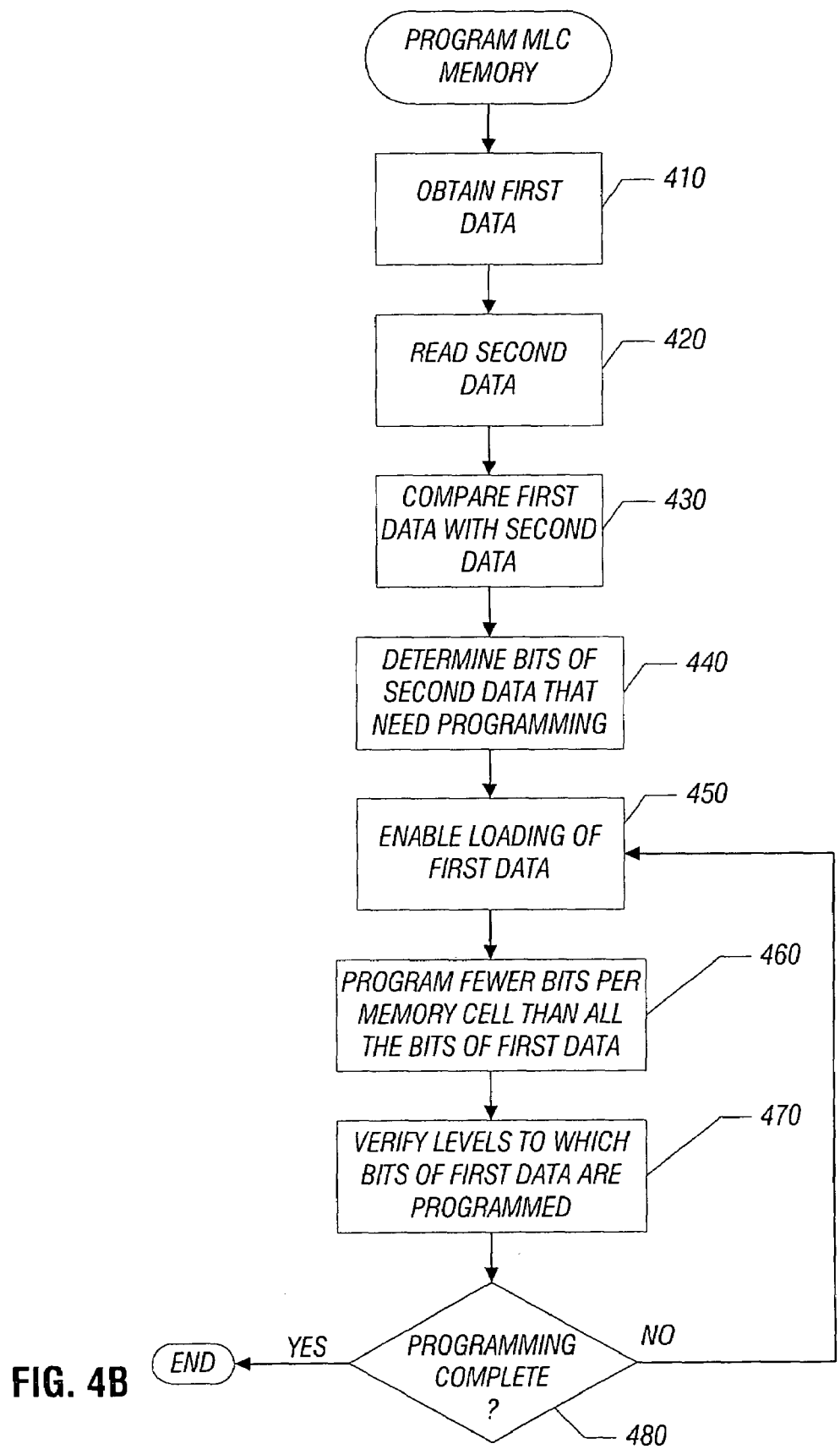

Turning now to FIGS. 4a and 4b, some embodiments of the technique for programming the MLC flash memory device using the hardware in FIG. 2 and FIG. 3 is shown. FIG. 4a shows the basic technique for programming MLC memory for some embodiments of the invention. A first data 415 is obtained from the processor executing software. A second data 425 is obtained from the MLC memory, with the second data different from the first data. First data is compared with second data in 435 and the comparison is used to program the MLC memory 445. The technique shown in FIGS. 4a and 4b may be adapted to test the MLC flash memory device 141. FIG. 4b shows in greater detail the programming of MLC memory. Program selection logic 260 after loading a bit pattern into register first data (block 410) in programmable element 270 informs the I/F controller 230 that it is ready to program the memory cell. The I/F controller enables the read signal 237 to read the content of second data 249 in 420. Second data is output from cell memory 235 over read data bus 251 to write I/F 255 for comparison with first data in 430. The bits of second data that need programming are determined in 440. If second data contains the same bit pattern as first data, first data is loaded with a clear indicator as shown in block 450 to prevent program pulsing. The bit sequence leading to the desired value to be stored in the memory cell is loaded into the first data register 280 as shown in block 450. Thus, for example, if the bit pattern to be stored in the memory cell is 00 and the current bit pattern in the memory cell is 11, first data 280 contains the bit pattern 00 for proper pulsing to reach the $V_T$ indicating the second data value of 00. The program pulsing fewer bits per memory cell than all the bits of first data is shown in 460 of FIG. 4b. After pulsing to reach the $V_T$ for the bit pattern, write I/F verifies that the proper voltage level has been programmed as shown in block 470. If programming of the memory cell is not complete as shown in 480, the next bit pattern in the sequence is loaded into first data 450 for program pulsing 460 and verification 470.

Figure 5:
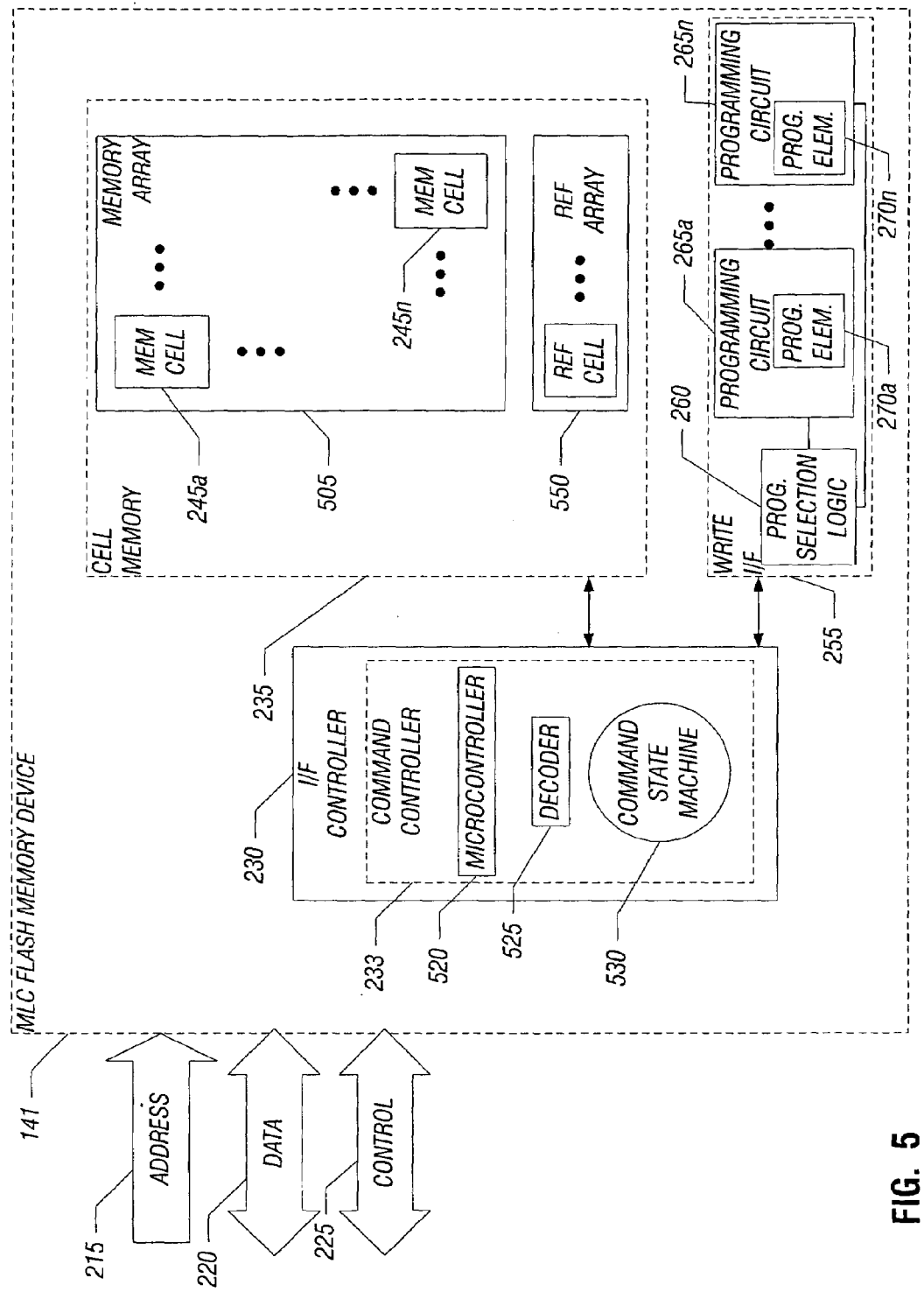
FIG. 5 is a schematic depiction of a MLC flash memory device showing the command controller and test hardware according to an embodiment of the invention.

Referring to FIG. 5, a schematic depiction of a MLC flash memory device including test hardware is shown. The command controller 233 that is a part of I/F controller 230 includes a microcontroller 520, decoder 525, and command state machine 530. As described above, the I/F controller decodes program load commands, read commands and other commands received by the MLC flash memory device 141 using the decoder 525. After decoding the command, microcontroller 520 and command state machine 530 control the execution of the command through appropriate control lines as shown in FIG. 2 and described above. The write I/F controller 255 includes program selection logic 260 coupled to a number of programming circuits that include program elements 270a–270n capable of programming memory cells 245a–245n in the memory array. Reference array 550 in cell memory 235 is test hardware that is used during testing of each memory cell as described below with reference to FIG. 6.

Figure 6:
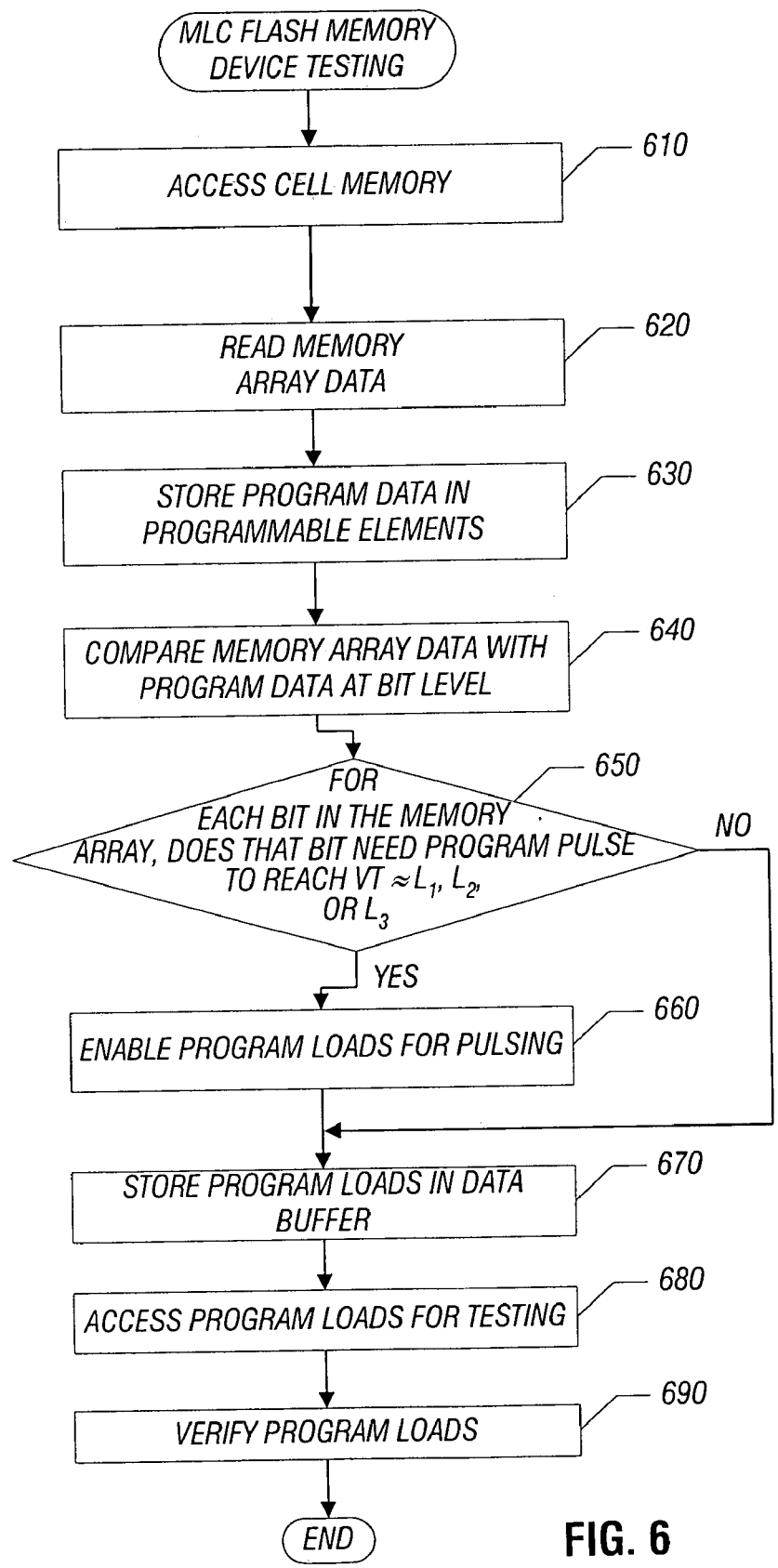
FIG. 6 is a flow chart showing a technique for testing of MLC flash memory cells in accordance with an embodiment of the invention.

FIG. 6 shows a flow chart for testing of MLC flash memory cells using the test hardware shown in FIG. 5. To reduce test time and cost, in some embodiments of the invention the test algorithm operates on a data path architecture of 64 bit program load commands, 128 bit verify commands and storage of 512 bits of test patterns in a low latency data buffer. Once the MLC flash memory device 141 is placed into test mode by an external tester or the processor executing test software, the command controller 233 accesses the cell memory 235 in block 610 to read the contents of memory array 505 as shown in block 620. Each of a pair of data bits read from the memory array 505 is stored into reference array 550 in cell memory 235. In this embodiment of the invention, because the algorithm operates on 64 bit program load commands, the reference array 550 may be 64 bits in program length or 32 reference cells (32×2=64 bits). In 630, the test data for programming the memory array is stored into programmable elements 270a–270n. In this embodiment of the invention, 32 programmable elements for storage of the 64 bit memory array are required. A bitwise comparison of the memory array data stored in reference array 550 with the test data stored in the programmable elements is performed as shown in block 640. In block 650, the command controller 233 in cooperation with the program selection logic 260 determines for each bit in the memory array whether that bit needs program pulses to reach a $V_T$ corresponding to L1, L2, or L3. If the memory cell requires program pulsing to reach a higher voltage threshold, then program load commands for pulsing are enabled for the memory cell as shown in block 660. In block 670, the program load commands are stored in the data buffer 325 of program selection logic 260, and accessed and executed to test the memory cells of the memory array, 680. In some embodiments of the invention, after the program load commands have stored the appropriate bit patterns into the memory cells of two 64 bit memory arrays, 128 bit verify commands verify the program loads as shown in block 690. Verification of 128 bit program load commands includes verifying that the proper $V_T$ level has been reached for each of the 64 memory cells.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    obtaining second data from a multilevel cell memory and first data, wherein said first data is different from said second data;
    comparing said first data with said second data;
    programming the multilevel cell memory based, at least in part, on said comparison of said first data and said second data; and
    wherein said obtaining, comparing, and programming are used to test the multilevel cell memory.

2. The method of claim 1, wherein programming the multilevel cell memory comprises:
    accessing a plurality of memory cells in the multilevel cell memory; and
    determining a number of bits from said memory cells of said first data that need programming.

3. The method of claim 1, comprising:
    after programming a plurality of memory cells in the multilevel cell memory, verifying the levels to which said all bits in said second data are programmed at substantially the same bandwidth as programming a number of bits per memory cell of said first data.

4. The method of claim 1, comprising programming fewer bits per memory cell of said first data than said all of a number of bits available per memory cell of said first data.

5. The method of claim 1, comprising storing said first data in a data buffer.

6. The method of claim 1, comprising accessing said first data by loading all bits per memory cell of said first data into a programmable element.

* * * * *